(12) United States Patent
Chang et al.

(10) Patent No.: US 6,809,600 B2
(45) Date of Patent: *Oct. 26, 2004

(54) DUAL LOOP PHASE LOCK LOOPS USING DUAL VOLTAGE SUPPLY REGULATORS

(75) Inventors: Kun-Yung Ken Chang, Los Altos, CA (US); Yingxuan Li, Cupertino, CA (US); Stefanos Sidiropoulos, Palo Alto, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/336,570

(22) Filed: Jan. 3, 2003

(65) Prior Publication Data

US 2003/0107418 A1 Jun. 12, 2003

Related U.S. Application Data

(63) Continuation of application No. 09/953,712, filed on Sep. 17, 2001, now Pat. No. 6,504,438.

(51) Int. Cl.[7] ................................................. H03L 7/00
(52) U.S. Cl. .......................... 331/17; 331/10; 331/1 A
(58) Field of Search .............................. 327/156, 157, 327/159; 331/17, 25, 1 A, 10, 108 C, 108 D (56) References Cited

U.S. PATENT DOCUMENTS

| | | | |
|---|---|---|---|
| 4,935,702 A | * 6/1990 | Mead et al. | ............ 365/185.32 |
| 4,987,387 A | 1/1991 | Kennedy et al. | |
| 5,126,692 A | 6/1992 | Shearer et al. | |
| 5,166,641 A | 11/1992 | Davis et al. | |
| 5,315,623 A | 5/1994 | Kuo | |
| 5,334,951 A | 8/1994 | Hogeboom | |
| 5,334,953 A | 8/1994 | Mijuskovic | |
| 5,412,349 A | 5/1995 | Young et al. | |
| 5,477,193 A | 12/1995 | Burchfield | |
| 5,504,459 A | 4/1996 | Gersbach et al. | |
| 5,614,855 A | 3/1997 | Lee et al. | |
| 5,642,082 A | 6/1997 | Jefferson | |
| 5,687,201 A | 11/1997 | McClellan et al. | |
| 5,703,511 A | 12/1997 | Okamoto | |
| 5,727,037 A | 3/1998 | Maneatis | |
| 5,739,681 A | * 4/1998 | Allman | ........................ 323/314 |
| 5,796,673 A | 8/1998 | Foss et al. | |
| 5,821,818 A | 10/1998 | Idei et al. | |
| 5,854,575 A | 12/1998 | Fiedler et al. | |
| 5,912,574 A | 6/1999 | Bhagwan | |
| 6,054,903 A | 4/2000 | Fiedler | |
| 6,255,872 B1 | 7/2001 | Harada et al. | |
| 6,504,438 B1 | * 1/2003 | Chang et al. | .................. 331/17 |

OTHER PUBLICATIONS

Maneatis, "Low–Jitter Process–Independent DLL and PLL Based on Self–Biased Techniques", IEEE Journal of Solid–State Circuits, vol. 31, No. 11. pp. 1723–1732, (Nov. 1996).

Sidiropoulos et al.; "A Semi–Digital Dual Delay Locked Loop," IEEE Journal of Solid–State Circuits, vol. 32, No. 11, pp. 1683–1692, (No. 1997).

(List continued on next page.)

Primary Examiner—Timothy P. Callahan
Assistant Examiner—An T. Luu
(74) Attorney, Agent, or Firm—Lee & Hayes, PLLC (57) ABSTRACT

Dual loop phase lock loops having a high loop bandwidth with low power consumption are described. Each loop is provided with a voltage supply regulator circuit which regulates the voltage of a portion of each loop. In one embodiment, the outer loop employs a regulation circuit comprising a two stage operational amplifier which is compensated by a compensation circuit that is configured to ensure that the dominant pole of the operational amplifier is associated with the first stage of the operational amplifier.

38 Claims, 3 Drawing Sheets

OTHER PUBLICATIONS

Garlepp et al.; "A Portable Digital DLL Architecture for CMOS Interface Circuits", Proceedings of the 1998 Symposium on VLSI Circuits, pp. 214–215, (Jun. 1998).

Von Kaenel, "High–Speed, Low–Power Clock Generator for a Microprocessor Applications," IEEE Journal of Solid–State Circuits, vol. 33, No. 11; pp. 1634–1639, (Nov. 1998).

Draper et al; "Circuit Techniques in a 266 MHz–Enabled Processor", IEEE Journal of Solid–State Circuits, vol. 32, No. 11, pp. 1650–1664, (Nov. 1997).

Griffin et al; "A Process–Independent, 800–MB/s DRAM Byte–Wide Interface Featuring Command Interleaving and Concurrent Memory Operation", IEEE Journal of Solid–State Circuits, vol. 33, No. 11, pp. 1741–1751; (Nov. 1998).

Saieki, "A Direct–Skew–Detect Synchronous Mirror Delay for Application–Specific Integrated Circuits," IEEE Journal of Solid–State Circuits, vol. 34, No. 3, pp. 372–379, (Mar. 1999).

Lee et al; "A2.5V CMOS Delay–Locked Loop for an 18Mbit, 500Megabyte/s DRAM," IEEE Journal of Soild–State Circuits, vol. 29, No. 12; pp. 1591–1496, (Dec. 1994).

Sonntag et al, "A Monolithic CMOS 10MHz DPLL for Burst–Mode Data Retiming," IEEE International Solid States Circuits Conference (ISSCC) Feb. 16, 1990.

Novof et al; "Fully Integrated CMOS Phase–Locked Loop with 15 to 240 MHz Locked Range and +50ps Jitter"; IEEE Journal of Solid–State Circuits, vol. 30, No. 11; pp. 1259–1268, (Nov. 1996).

Gardner, "Charge–Pump Phase–Lock Loops"; IEEE Trans. Comm. vol. COM–28, pp. 77–88; (Nov. 1980).

Kondoh et al; "A 622 Mbfs 8+8 ATM Chip Set with Shared Multibuffer Architecture," IEEE Journal of Solid State Circuits, vol. 28; No. 7, pp. 808–815 (Jul. 1993).

Von Kaenel et al; "A 320 MHz 1.5mW @ 1.35 V CMOS PLL for Microprocessor Clock Generation", IEEE Journal of Solid–State Ciruits, vol. 31; No. 11; pp. 1715–1722, (Nov. 1996).

Muuskovic et al; Cell–Based Fully Integrated CMOS Frequency Synthesizers, IEEE Journal of Solid–State Circuits, vol. 29, No. 3; pp. 271–279, Mar. 1994.

Young et al; "A PLL Clock Generator with 5 to 100 MHz of Lock Range for Microprocessors" IEEE Journal of Solid–State Circuits, vol. 27, No. 11, pp. 1599–1607, Nov. 1992.

Notani et al, "A 622–MHz CMOS Phase–Locked Loop with Precharge–Type Phase Frequency Detector", IEEE 1994 Symposium on VLSI Circuits Digest of Technical Papers; pp. 129–130; (1994).

Sidiropoulos et al; "A CMOS 500 Mbps/pln Synchronous Point to Point Link Interface", IEEE 1994 Symposium on VLSI Circuits Digest of Technical Papers, pp. 43–44 (1994).

Alvarez et al; "A Wide–Bandwidth Low–Voltage PLL for PowerPC Microprocessors"; IEEE 1994 Symposium on VLSI Circuits Digest of Technical Papers, pp. 37–38; (1994).

Rezzi et al., "A PLL–Based Frequency Synthesizer for 160–MHz Double Sampled SC Filters"; IEEE Journal of Solid–State Circuits; vol. 31; No. 10, pp. 1560–1564, (Oct. 1996).

Lee et al; "A CMOS Serial Link for Fully Duplexed Data Communication", IEEE Journal of Solid–State Circuits, vol. 30, No. 4, pp. 353–363, (Apr. 1995).

Jeong et al, "Design of PLL–Based Clock Generation Circuits", IEEE Journal of Solid State Circuits, vol. so–22, No. 2; pp. 255–261, (Apr. 1987).

Gu–Yeon Wei et al., "A Variable–Frequency Parallel I/O Interface with Adaptive Power–Supply Regulation," IEEE Journal of Solid–State Circuits, vol. 35, No. 11, Nov. 2000, pp. 1600–1610.

* cited by examiner

DUAL LOOP PHASE LOCK LOOPS USING DUAL VOLTAGE SUPPLY REGULATORS

RELATED APPLICATIONS

This is a continuation application and priority is claimed to U.S. patent application Ser. No. 09/953,712, filed Sep. 17, 2001, now U.S. Pat. No. 6,504,438 the disclosure of which is incorporated by reference herein.

TECHNICAL FIELD

This invention relates to phase lock loops and, in particular, to dual-loop phase lock loops.

BACKGROUND

Clock recovery circuits are required in many of today's high speed integrated circuit devices to generate a clock signal having a certain timing relationship with a reference signal. Clock recovery circuits can be employed to generate clock signals having a synchronous, controlled and/or pre-determined relationship with a reference signal such as an external clock signal. By integrating clock recovery circuitry into a clock system of, for example, a microprocessor or synchronous memory device, difficulties relating to maintaining or ensuring signal integrity and clock skew can be overcome. In addition, reliable clocking operations which support very high speed circuit implementations can be achieved.

One type of a clock recovery circuit is a phase lock loop (PLL). A phase lock loop circuit, for example, utilizes a voltage controlled oscillator (VCO) to generate a recovered clock signal having a certain timing relationship with a reference signal. A dual loop phase lock loop can incorporate so-called phase mixers (more appropriately termed "phase adjusters") in a second loop of the PLL. The phase mixers are associated with voltage controlled oscillator and can provide a feedback loop to a suitable phase frequency detector which detects differences in the phase frequency between the output of the phase mixers (an internal clock) and a reference clock (an external clock).

One problem associated with dual loop phase lock loops is that of trying to maintain high loop bandwidth for the inner analog PLL loop while maintaining low power consumption. Accordingly, this invention arose out of concerns associated with providing improved dual loop phase lock loops having a suitably high inner loop bandwidth while maintaining low power consumption.

DETAILED DESCRIPTION

Overview

In the embodiments described below, a dual loop phase lock loop is provided having a high loop bandwidth for the inner PLL loop with low power consumption. Each of the loops of the dual loop is provided with a supply regulator circuit which regulates the voltage of a portion of each loop. In one embodiment, regulation of the voltage of the outer loop of the dual loop phase lock loop takes place through the use of a regulation circuit comprising a two stage operational amplifier. To stabilize the operational amplifier, it is compensated by adding a compensation circuit at the output of the first stage so that the dominant pole of the operational amplifier is associated with the first stage of the operational amplifier and not the second stage of the operational amplifier. This can reduce the power consumption of the first stage. In a preferred embodiment, the compensation circuit comprises one or more capacitors that are operably connected to the output of the first stage of the operational amplifier.

Exemplary Dual Loop Phase Lock Loop Embodiment

For purposes of the discussion below, the reader is assumed to have some familiarity with clock recovery circuits such as phase lock loops and delay lock loops. For background on the operation of such circuits, the reader is referred to the following documents (both of which are assigned to the assignee of this document) which are incorporated by reference herein: U.S. patent application Ser. No. 09/303,669, filed on May 3, 1999 and U.S. Pat. No. 6,125, 157. Additional material on dual loop phase lock loops can be found in U.S. Pat. Nos. 5,912,574, 5,854,575, and 6,054, 903.

Figure 1:
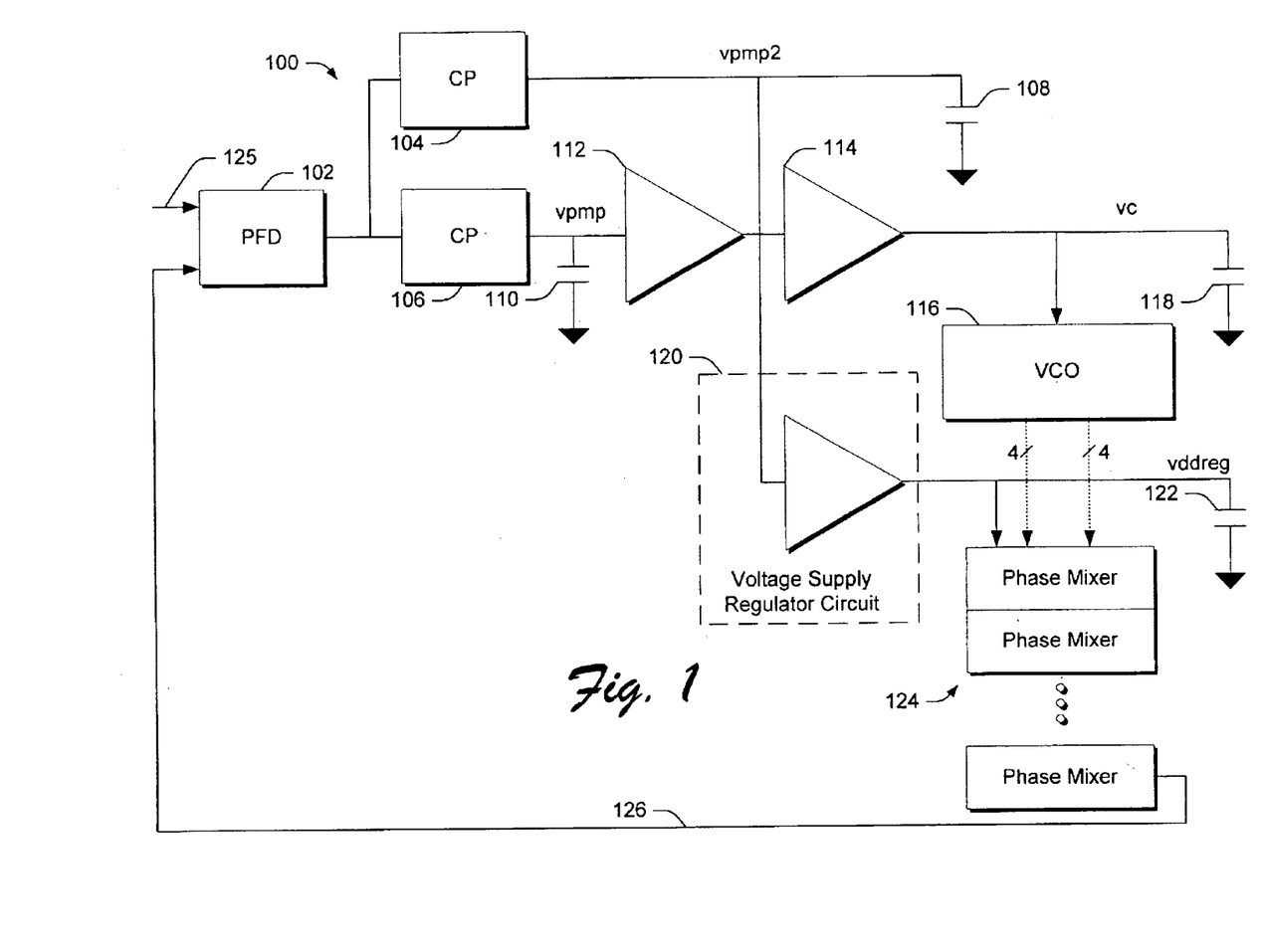
FIG. 1 is a block diagram of an exemplary dual loop phase lock loop having dual voltage supply regulators in accordance with one embodiment.

FIG. 1 shows an exemplary phase lock loop circuit 100 in accordance with one embodiment. In the illustrated example, phase lock loop circuit 100 is configured as a dual loop phase lock loop having dual supply regulators.

Phase lock loop circuit 100 comprises, in this example, a phase frequency detector 102 the output of which is connected to charge pumps 104 and 106. A capacitor 108 is connected to the output of charge pump 104 and provides a filter capacitor to smooth out ripples as well as introduce the third order pole. A capacitor 110 is connected to the output of charge pump 106 and provides the main charge pump capacitor. The output of charge pump 106 is connected to a first operational amplifier 112. The output of the first operational amplifier is connected to a second operational amplifier 114. The output of the second operational amplifier 114 is provided to a voltage controlled oscillator 116. A capacitor 118 is connected to the output of the second operational amplifier 114 and provides sufficient phase margin on operational amplifier 114. In addition, capacitor 118 bypasses any noise on the regulated supply due to the switching of the voltage controlled oscillator 116. Collectively the phase frequency detector 102, charge pumps 104, 106, operational amplifiers 112, 114 and voltage controlled oscillator 116 define a first loop of the illustrated phase lock loop circuit 100.

In this particular embodiment, charge pump 104 and operational amplifier 112 provide the zero to stabilize the loop, as will be understood by the skilled artisan. The second operational amplifier 114 comprises a voltage supply regulator for the voltage controlled oscillator 116. In this embodiment, second operational amplifier 114 supports the voltage controlled oscillator current which is approximately 1.5 mA for 3.125 Gbps in 0.13 um CMOS. More importantly, second operational amplifier 114 supports high bandwidth so that the third order pole is at the node between charge pump 104 and capacitor 108.

A second or outer loop of the phase lock loop circuit 100 is provided by a voltage supply regulator circuit 120, phase mixer assembly 124 and a feedback line 126 coupled between the phase mixer assembly 124 and the phase frequency detector 102. A capacitor 122 is connected to the output of the voltage supply regulator circuit 120 and provides the bypass capacitor of the outer loop. In this example, the voltage supply regulator circuit 120 is implemented as a linear regulator, and preferably an operational amplifier as shown. Phase mixer assembly 124 receives, as input, the output of the voltage controlled oscillator 116 and the voltage supply regulator circuit 120.

For low power reasons, phase mixer assembly 124 is powered by an unregulated power supply, not vddreg.

One advantage of using a linear regulator and, in particular, an operational amplifier for the second voltage supply regulator circuit is that all of the components of the dual loop phase lock loop circuit can be totally integrated on a common integrated circuit chip.

Exemplary Voltage Regulator Circuit

As indicated above, the second loop of the dual loop phase lock loop circuit 100 includes a novel voltage supply regulator circuit 120. One reason for providing voltage supply regulator circuit 120 is to reduce the power consumption of the dual loop phase lock loop circuit 100 as well as increase its performance.

As a motivation for incorporation of the voltage supply regulator circuit 120 in the outer loop of the dual loop phase lock loop circuit 100, consider the following. For the first loop (also called the VCO loop) of circuit 100, the bandwidth has to be high. That is, there is typically a fairly stringent requirement on the loop bandwidth of the phase lock loop (e.g. it has to be $\frac{1}{10}^{th}$ of the phase detection rate). To keep the high loop bandwidth of the first loop, the bandwidth for the associated operational amplifiers (i.e. operational amplifiers 112, 114) has to be high (e.g. 10 times higher than the loop bandwidth). For example, if the voltage controlled oscillator 116 is operating at 1 GHz and the frequency phase detector is at 200 MHz, then the loop bandwidth for the voltage controlled oscillator is usually 20 MHz. To keep the loop bandwidth at 20 MHz, the operational amplifier bandwidth has to be on the order of 10 times higher—which makes it 200 MHz. In the voltage regulator in an operational amplifier design, a higher bandwidth means more power consumption. In this embodiment, since it is desirable to reduce the power consumption, having a higher bandwidth on the operational amplifier in the outer loop is undesirable. Accordingly, to save power in this design, it is undesirable to use a single operational amplifier to drive both the voltage controlled oscillator 116 and the phase mixer assembly 124.

Looking at the loop dynamics of the illustrated phase lock loop circuit 100, the bandwidth of the outer loop is lower than the bandwidth of the inner loop. The outer loop can actually be de-coupled, in a sense, from the inner voltage controlled oscillator loop. Accordingly, the bandwidth requirements for the voltage supply regulator circuit 120 of the outer loop are much less. Because there is not as stringent a requirement on the bandwidth of the outer loop, one can have a much lower bandwidth there. Thus, a separate voltage supply regulator circuit is provided for the outer loop. The separate voltage supply regulator circuit focuses on lower bandwidth and low power.

Another design aspect to consider is as follows. The phase mixer assembly 124 provides feedback to the phase frequency detector 102. In some senses then, the outer loop voltage supply regulator circuit 120 is also part of the inner or voltage controlled oscillator loop. The reason that the outer loop voltage supply regulator circuit 120 does not have the same bandwidth requirement as the inner loop is that, from a circuit standpoint, the voltage controlled oscillator gain is much much higher than the outer loop gain, as will be appreciated by those of skill in the art.

The illustrated phase lock loop circuit 100 operates as follows. The PFD (Phase Frequency Detector) circuit 102 compares the input reference clock 125 and the feedback clock 126. A clock divider (not shown but before PFD 102) provides an adequate divide ratio between the VCO clock and the input reference clock. The output of the PFD circuit 102 then drives both the charge pump circuits 106 and 104 respectively. The main charge pump 106 drives the main filter capacitor to produce voltage vpmp. Vpmp drives the operational amplifier 112 to produce vpmp2, which is modulated by the auxiliary charge pump 104 to produce the zero. Vpmp2 then drives both operational amplifiers 114 and 120. The operational amplifier 114 drives the VCO and regulates its supply. The operational amplifier 120 drives the circuits in the outer loop 124. Both capacitors 118 and 122 provide the bypassing function on the power supply of the VCO 116 and the phase mixers 124. One of the phase mixers 124 feedback the clock to the clock divider for the input of PFD 102. The VCO provides eight clock phases in a VCO clock cycle in this embodiment. The phase mixer circuit 124 in the outer loop selects two adjacent phases and interpolates between them to generate finer resolution of the clock phases. As described before, the bandwidth of the operational amplifiers 114 and 112 must be higher than about 10 times that of the loop bandwidth of the inner VCO loop. The bandwidth of the operational amplifier 120 does not have such a constraint. In the figure, it only needs to be higher than the loop bandwidth of the outer loop, which is commonly the CDR (Clock Data Recovery) loop bandwidth and is usually below 1 MHz for 3.125 Gb/s or 2.5 Gb/s applications. This is much lower than 20 MHz VCO loop bandwidth. As a result, one can focus on reducing the power consumption of the operational amplifier 120 because of the lower bandwidth constraint.

Exemplary Two Stage Operational Amplifier

Figure 2:
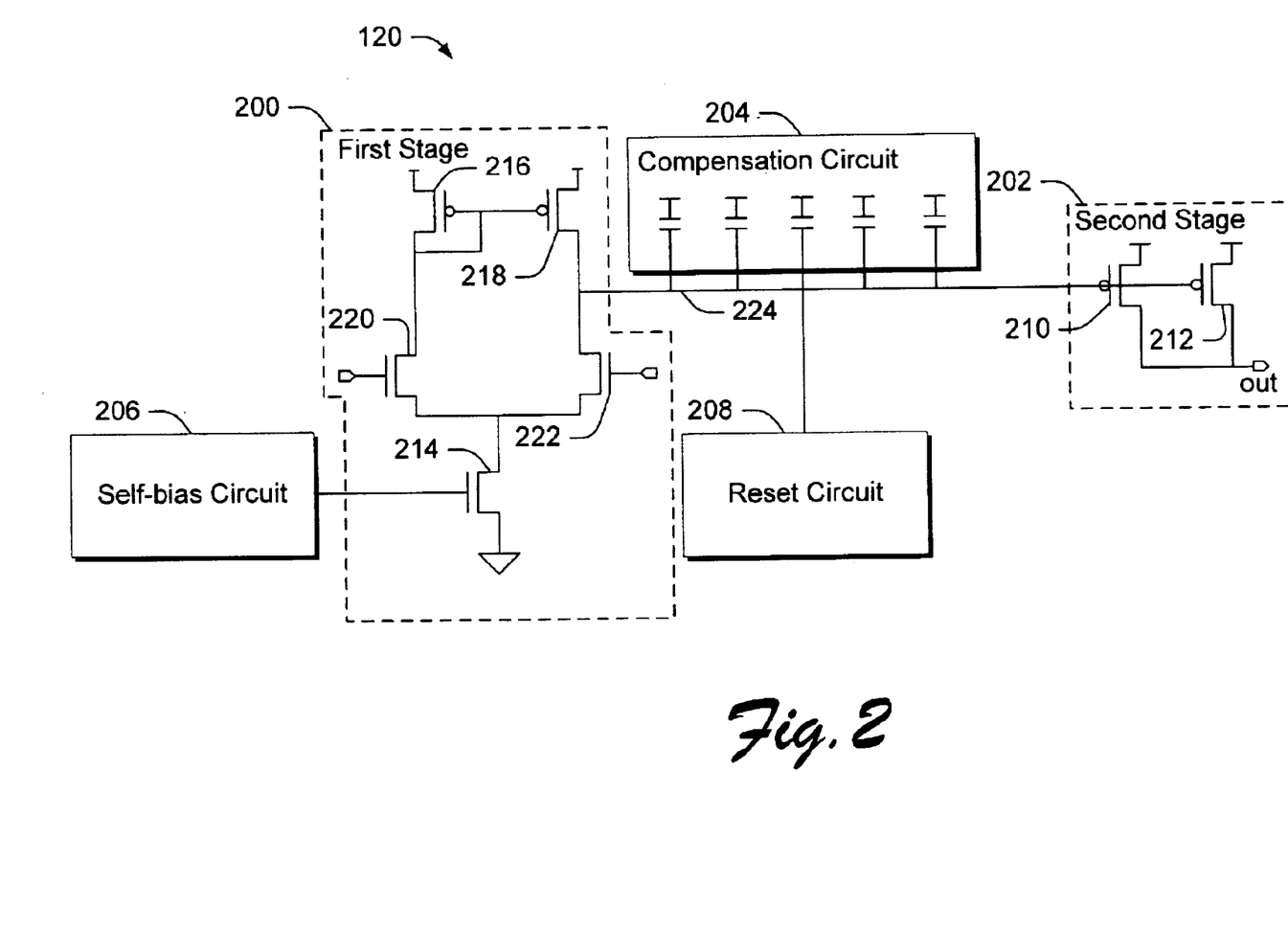
FIG. 2 is a schematic diagram of an exemplary two stage operational amplifier that can be used to implement a voltage supply regulator for the outer loop of the FIG. 1 dual loop phase lock loop.

In a preferred embodiment, voltage supply regulator circuit 120 in the outer loop of the phase lock loop circuit 100 is implemented as a linear two stage operational amplifier. For low power reasons, the operational amplifier of the voltage supply regulator circuit 120 cannot consume too much current (e.g. <<1 mA), but it has to regulate up to 10 to 15 mA. The bandwidth of the operational amplifier of the voltage supply regulator circuit 120 does not affect the overall loop stability because the gain (i.e. phase/voltage) is much smaller than the VCO gain. As a result, the operational amplifier of the voltage supply regulator circuit 120 does not need to have a high bandwidth. However, a higher bandwidth does introduce smaller jitter than a lower bandwidth, as will be appreciated by the skilled artisan. Additionally, a design consideration pertaining to the operational amplifier of the voltage supply regulator circuit 120 is that it should have a small offset. This reduces the variation between vddreg and vpmp2, and thus vpmp and vc With these constraints in mind, FIG. 2 shows an exemplary two stage operational amplifier 120 in accordance with one embodiment. In the illustrated example, the operational amplifier includes a first stage 200, a second stage 202, and a compensation circuit 204. Also provided, although not forming part of the two-stage operational amplifier is a self-bias circuit 206 and a reset circuit 208.

First stage 200 provides a high gain while second stage 202 provides high current.

First stage 200 includes a bias transistor 214. The self-bias circuit 206 generates a bias voltage which is applied to the bias transistor 214. The bias voltage biases and modulates the bias transistor 214. Here, the bias voltage controls the bias transistor 214 so as to increase or decrease the amount of current flowing through bias transistor 214. The bias transistor acts as a current source for the first stage 200.

First stage 200 includes a current mirror load circuit having a first load transistor 216 coupled in parallel with a second load transistor 218. An input transistor 220 is coupled in series with the load transistor 216 to provide a first current flowing through the node therebetween. An input transistor 222 is coupled in series with the load transistor 218 to provide a second current flowing through output node 224. The first current flowing through the node between transistors 216, 220 biases the load transistors 216, 218. The second current is mirrored to flow in a direction opposite the first current at the output node 224, as will be appreciated and understood by those of skill in the art.

To prevent lowering its bandwidth too much, any pole splitting compensation is avoided. As a result, compensation can take place in a straight-forward manner by providing a compensation circuit 204 implemented as one or more capacitors operably connected to the output node 224 of the first stage 200. In addition, to drive high output current, output devices of the second stage (designated at 210, 212) are very large. In 0.13 um CMOS technology, to provide 15 mA, each device can be as large as 2.5 mm wide for 0.5 um channel length. The overlap capacitance between the output and the compensation node 224 introduces some compensation due to Miller effect, as will be understood by the skilled artisan. Reset circuit 208 is provided to start up the phase lock loop circuit. Additionally, self-bias circuit 206 biases the operational amplifier by vpmp so that its bandwidth is proportional to the operation frequency.

The current of the output devices 210, 212 is the current of the outer loop so it is not part of the power budget of operational amplifier 120. The power budget of the operational amplifier 120 comes from the bias circuit 206 and the first stage 200. To increase the phase margin, the output impedance of the first stage should be large (e.g. >100 kOhms in our exemplary implementation). This means that reducing the current, in fact, helps to increase the phase margin. However, it also reduces the bandwidth of the operational amplifier. Accordingly, the current of the operational amplifier is set by the requirements of the phase margin and the bandwidth, as will be appreciated and understood by those of skill in the art.

Exemplary Method

Figure 3:
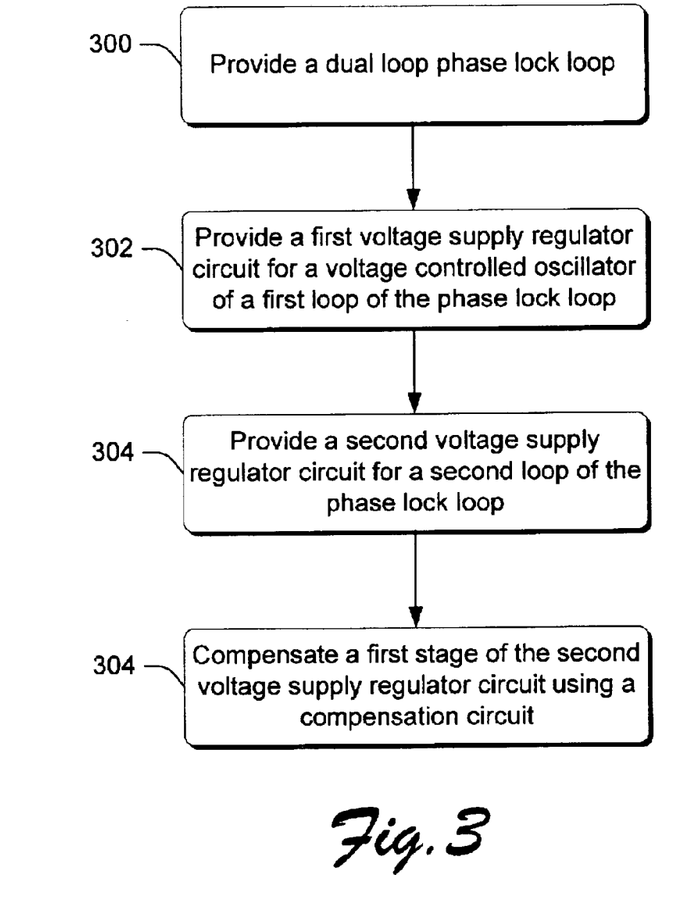
FIG. 3 is a flow diagram that describes steps in a method in accordance with one embodiment.

FIG. 3 is a flow diagram that describes steps in a method in accordance with one embodiment. The steps can be implemented in any suitable circuitry. In one embodiment, the steps are implemented using semiconductor processing techniques to fabricate integrated circuitry on a single integrated circuit chip.

Step 300 provides a dual loop phase lock loop. An exemplary dual loop phase lock loop is shown and described in connection with FIG. 1. In that example, the first loop of the phase lock loop includes a voltage controlled oscillator and the second loop of the phase lock loop includes a phase mixer assembly. Step 302 provides a first voltage supply regulator circuit for the voltage controlled oscillator of the first loop. In the FIG. 1 example, the first voltage supply regulator is implemented in the form of an operation amplifier 114. Step 304 provides a second voltage supply regulator circuit for the second loop. In the FIG. 1 example, an exemplary second voltage supply regulator circuit is shown at 120 and is operably associated with a phase mixer assembly 124. In the illustrated example, the second voltage supply regulator circuit is implemented as a linear regulator. Preferably, the linear regulator comprises a two stage operational amplifier. An exemplary operational amplifier is shown and described in connection with FIG. 2.

Step 306 compensates the first stage of the second voltage supply regulator circuit through the use of a suitable compensation circuit. In the example of FIG. 2, the compensation circuit is implemented as one or more capacitors connected to the output node of the first stage.

It is to be appreciated and understood that the specifically illustrated and described circuit implementations constitute but examples of exemplary circuitry. Accordingly, it is possible for variations to be made to the illustrated circuitry without departing from the spirit and scope of the claimed subject matter.

CONCLUSION

The embodiments described above can provide dual loop phase lock loops that maintain high bandwidth with low power consumption. Other advantages will be apparent to those of skill in the art.

Although the invention has been described in language specific to structural features and/or methodological steps, it is to be understood that the invention defined in the appended claims is not necessarily limited to the specific features or steps described. Rather, the specific features and steps are disclosed as preferred forms of implementing the claimed invention.

What is claimed is:

1. A circuit comprising:
    an inner loop having a first loop bandwidth, and an outer loop having a second loop bandwidth, wherein the second loop bandwidth is lower than the first loop, bandwidth;
    a separate supply regulator circuit for each loop that respectively regulates voltage of at least a portion of each loop;
    the supply regulator circuit for the outer loop comprising a two stage operational amplifier and a compensation circuit operably coupled with an output of a first stage of the two stage operational amplifier; and
    the compensation circuit being configured so that the dominant pole of the two stage operational amplifier is associated with the first stage of the two stage operational amplifier and not a second stage of the two stage operational amplifier.

2. The circuit of claim 1, wherein the compensation circuit comprises one or more capacitors.

3. The circuit of claim 1, wherein the first stage of the two stage operational amplifier is configured to provide an output gain, and the second stage of the two stage operational amplifier is configured to provide an output current.

4. The circuit of claim 1, wherein the first stage of the two stage operational amplifier comprises:
    a bias transistor for increasing or decreasing an amount of current flowing therethrough, the bias transistor providing a current source for the first stage;
    a current mirror load circuit coupled with the bias transistor and comprising:
    a first load transistor;
    a second load transistor coupled in parallel with the first load transistor;
    a first input transistor coupled in series with the first load transistor to provide a first current flowing through a node therebetween;

a second input transistor coupled in series with the second load transistor to provide a second current flowing through an output node of the first stage, wherein:
the first current biases the first and second load transistors; and
the second current is mirrored to flow in a direction opposite the first current at the output node.

5. The circuit of claim 4, wherein said compensation circuit comprises one or more capacitors connected to the output node of the first stage.

6. The circuit of claim 4, wherein the second stage of the two stage operational amplifier comprises at least one transistor having a gate connected to the output node of the first stage.

7. The circuit of claim 4, wherein the second stage of the two stage operational amplifier comprises at least a pair of transistors connected in parallel and having their gates connected to the output node of the first stage.

8. A method comprising:
inputting an input reference clock signal and a feedback clock signal to a detector circuit having an output;
driving a main charge pump and an auxiliary charge pump with the output of the detector circuit, the main charge pump and the auxiliary charge pump having respective outputs;
driving a filter capacitor with the output of the main charge pump sufficient to provide a first voltage $v_{pmp}$;
driving a first operational amplifier with the first voltage $v_{pmp}$ sufficient to provide an output voltage $v_{pmp2}$ which is modulated by the auxiliary charge pump;
driving a pair of operational amplifiers with the voltage $v_{pmp2}$;
using a first of said pair of operational amplifiers, driving a voltage controlled oscillator which comprises a portion of a first circuit, said voltage controller oscillator comprising multiple outputs which are input into a portion of a second circuit;
using a second of said pair of operational amplifiers, driving circuits comprising a portion of the second circuit; and
using at least the second circuit, providing feedback to the detector circuit.

9. The method of claim 8, wherein said detector circuit comprises a phase frequency detector circuit.

10. The method of claim 8, wherein said act of driving circuits comprising a portion of a second circuit comprises driving a phase mixer assembly.

11. The method of claim 8, wherein said act of driving circuits comprising a portion of a second circuit comprises driving a phase mixer assembly, one phase mixer of which provides said feedback.

12. The method of claim 8, wherein said multiple outputs of said voltage controller oscillator provide eight clock phases in a VCO clock cycle.

13. The method of claim 8, wherein:
said act of driving circuits comprising a portion of a second circuit comprises driving a phase mixer assembly, one phase mixer of which provides said feedback;
wherein said multiple outputs of said voltage controller oscillator provide eight clock phases in a VCO clock cycle, and further comprising:
using said phase mixer assembly, selecting two adjacent clock phases in the VCO clock cycle and interpolating between the two adjacent clock phases to generate a finer resolution of the clock phases.

14. The method of claim 8, wherein said first of the pair of operational amplifiers and said first operational amplifier have bandwidths that are higher than about 10 times the bandwidth of the first circuit.

15. The method of claim 8, wherein said first of the pair of operational amplifiers and said first operational amplifier have bandwidths that are higher than about 10 times the bandwidth of the first circuit, and wherein said second of the pair of operational amplifiers has a bandwidth that is higher than the bandwidth of the second circuit.

16. A method comprising:
inputting an input reference clock signal and a feedback clock signal to a phase frequency detector circuit having an output;
driving a main charge pump and an auxiliary charge pump with the output of the phase frequency detector circuit, the main charge pump and the auxiliary charge pump having respective outputs;
driving a filter capacitor with the output of the main charge pump sufficient to provide a first voltage $v_{pmp}$;
driving a first operational amplifier with the first voltage $v_{pmp}$ sufficient to provide an output voltage $v_{pmp2}$ which is modulated by the auxiliary charge pump;
driving a pair of operational amplifiers with the voltage $v_{pmp2}$;
using a first of said pair of operational amplifiers, driving a voltage controlled oscillator which comprises a portion of a first circuit, said voltage controller oscillator providing eight clock phases in a VCO clock cycle which are input into a portion of a second circuit;
using a second of said pair of operational amplifiers, driving circuits comprising a portion of the second circuit, said circuit portion comprising a phase mixer assembly;
using said phase mixer assembly, selecting two adjacent clock phases in the VCO clock cycle and interpolating between the two adjacent clock phases to generate a finer resolution of the clock phases;
using a phase mixer of the phase mixer assembly, providing feedback to the phase frequency detector circuit; and
wherein said first of the pair of operational amplifiers and said first operational amplifier have bandwidths that are higher than about 10 times the bandwidth of the first circuit, and wherein said second of the pair of operational amplifiers has a bandwidth that is higher than the bandwidth of the second circuit.

17. A voltage supply regulator circuit comprising:
a first stage having an output node;
a compensation circuit connected to the output node;
a second stage connected to the output node;
the first stage comprising:
a bias transistor for increasing or decreasing an amount of current flowing therethrough, the bias transistor providing a current source for the first stage;
a current mirror load circuit coupled with the bias transistor and comprising:
a first load transistor;
a second load transistor coupled in parallel with the first load transistor;
a first input transistor coupled in series with the first load transistor to provide a first current flowing through a node therebetween;

a second input transistor coupled in series with the second load transistor to provide a second current flowing through the output node of the first stage, wherein:
  the first current biases the first and second load transistors; and
  the second current is mirrored to flow in a direction opposite the first current at the output node.

18. The voltage supply regulator circuit of claim 17, wherein the compensation circuit comprises one or more capacitors.

19. The voltage supply regulator circuit of claim 17, wherein the first stage of the two stage operational amplifier is configured to provide an output gain, and the second stage of the two stage operational amplifier is configured to provide an output current.

20. The voltage supply regulator circuit of claim 17, wherein the second stage comprises at least one transistor having a gate connected to the output node of the first stage.

21. The voltage supply regulator circuit of claim 17, wherein the second stage of the two stage operational amplifier comprises at least a pair of transistors connected in parallel and having their gates connected to the output node of the first stage.

22. A circuit comprising:
  an on chip inner loop having a first loop bandwidth, and an on chip outer loop having a second loop bandwidth that is lower than the first loop bandwidth;
  an on chip separate supply regulator circuit for each loop that respectively regulates voltage of a portion of each loop;
  the supply regulator circuit for the outer loop comprising a two stage operational amplifier and a compensation circuit operably coupled with an output of a first stage of the two stage operational amplifier; and
  the compensation circuit being configured so that the dominant pole of the two stage operational amplifier is associated with the first stage of the two stage operational amplifier and not a second stage of the two stage operational amplifier.

23. The circuit of claim 22, wherein the compensation circuit comprises one or more capacitors.

24. The circuit of claim 22, wherein the first stage of the two stage operational amplifier is configured to provide an output gain, and the second stage of the two stage operational amplifier is configured to provide an output current.

25. The circuit of claim 22, wherein the first stage of the two stage operational amplifier comprises:
  a bias transistor for increasing or decreasing an amount of current flowing therethrough, the bias transistor providing a current source for the first stage;
  a current mirror load circuit comprising:
    a first load transistor;
    a second load transistor coupled in parallel with the first load transistor;
    a first input transistor coupled in series with the first load transistor to provide a first current flowing through a node therebetween;
    a second input transistor coupled in series with the second load transistor to provide a second current flowing through an output node of the first stage, wherein:
      the first current biases the first and second load transistors; and
      the second current is mirrored to flow in a direction opposite the first current at the output node.

26. The circuit of claim 25, wherein said compensation circuit comprises one or more capacitors connected to the output node of the first stage.

27. The circuit of claim 25, wherein the second stage of the two stage operational amplifier comprises at least one transistor having a gate connected to the output node of the first stage.

28. The circuit of claim 25, wherein the second stage of the two stage operational amplifier comprises at least a pair of transistors connected in parallel and having their gates connected to the output node of the first stage.

29. A voltage supply regulator circuit comprising:
  an on chip first stage having an output node;
  an on chip compensation circuit connected to the output node;
  an on chip second stage connected to the output node;
  the on chip first stage comprising:
    a bias transistor for increasing or decreasing an amount of current flowing therethrough, the bias transistor providing a current source for the first stage;
    a current mirror load circuit coupled with the bias transistor and comprising:
      a first load transistor;
      a second load transistor coupled in parallel with the first load transistor;
      a first input transistor coupled in series with the first load transistor to provide a first current flowing through a node therebetween;
      a second input transistor coupled in series with the second load transistor to provide a second current flowing through the output node of the first stage, wherein:
        the first current biases the first and second load transistors; and
        the second current is mirrored to flow in a direction opposite the first current at the output node.

30. The voltage supply regulator circuit of claim 29, wherein the compensation circuit comprises one or more capacitors.

31. The voltage supply regulator circuit of claim 29, wherein the first stage of the two stage operational amplifier is configured to provide a an output gain, and the second stage of the two stage operational amplifier is configured to provide an output current.

32. The voltage supply regulator circuit of claim 29, wherein the second stage comprises at least one transistor having a gate connected to the output node of the first stage.

33. The voltage supply regulator circuit of claim 29, wherein the second stage of the two stage operational amplifier comprises at least a pair of transistors connected in parallel and having their gates connected to the output node of the first stage.

34. An on chip circuit comprising:
  an on chip first loop means;
  an on chip first voltage supply regulation means associated with the first loop means and configured to provide a first regulated voltage supply to at least a portion of the first loop means;
  an on chip second loop means; and
  an on chip second voltage supply regulation circuit means associated with the second loop means and configured to provide a second regulated voltage supply to at least a portion of the second loop means.

35. The on chip circuit of claim 34, wherein the first and second voltage supply regulation circuit means comprise operational amplifiers.

36. The on chip circuit of claim 35, wherein the second voltage supply regulation circuit means comprises a compensated operational amplifier.

37. The on chip circuit of claim 35, wherein the second voltage supply regulation circuit means comprises a two-stage operational amplifier.

38. The on chip circuit of claim 37, further comprising compensation circuit means operably connected to an output of a first stage of the second voltage supply regulation circuit means.

* * * * *

UNITED STATES PATENT AND TRADEMARK OFFICE
CERTIFICATE OF CORRECTION

PATENT NO. : 6,809,600 B2
DATED : October 26, 2004
INVENTOR(S) : Kun-Yung Ken Chang et al.

It is certified that error appears in the above-identified patent and that said Letters Patent is hereby corrected as shown below:

Title page,
Item [56], References Cited, U.S. PATENT DOCUMENTS, please add the following:
-- 6,316,987    Dally et al.    11/2001
   6,247,138    Tamura et al.   06/2001
   5,672,991    Thoma et al.    09/1997
   5,339,009    Lai             08/1994 --
OTHER PUBLICATIONS, "Muuskovic et al;" reference, replace "Muuskovic" with
-- Mijuskovic --.

Signed and Sealed this

Nineteenth Day of April, 2005

JON W. DUDAS
*Director of the United States Patent and Trademark Office*